(12) United States Patent
Wohlgemuth et al.

(10) Patent No.: US 8,234,926 B2
(45) Date of Patent: Aug. 7, 2012

(54) PRESSURE SENSOR WITH A CLOSED CAVITY CONTAINING AN INERT FILLING MEDIUM

(75) Inventors: Christian Wohlgemuth, Berlin (DE); Peter Thiele, Berlin (DE)

(73) Assignee: EPCOS AG, Munich (DE)

( * ) Notice: Subject to any disclaimer, the term of this patent is extended or adjusted under 35 U.S.C. 154(b) by 9 days.

(21) Appl. No.: 12/904,871

(22) Filed: Oct. 14, 2010

(65) Prior Publication Data

US 2011/0083513 A1 Apr. 14, 2011

Related U.S. Application Data

(63) Continuation of application No. PCT/EP2009/054656, filed on Apr. 20, 2009.

(30) Foreign Application Priority Data

Apr. 28, 2008 (DE) .......................... 10 2008 021 091

(51) Int. Cl.
*G01L 13/02* (2006.01)
*G01L 15/00* (2006.01)
(52) U.S. Cl. ............ 73/716; 73/715; 73/723; 361/283.4
(58) Field of Classification Search .................... None
See application file for complete search history.

(56) References Cited

U.S. PATENT DOCUMENTS

| | | | |
|---|---|---|---|
| 3,559,488 A | 2/1971 | Weaver | |
| 4,072,058 A | 2/1978 | Whitehead, Jr. | |
| 4,218,925 A | 8/1980 | DiDomizio, Jr. | |
| 4,543,832 A | 10/1985 | Van Over | |
| 5,071,661 A * | 12/1991 | Stubbs et al. | 426/96 |
| 5,119,066 A * | 6/1992 | Ballyns | 340/442 |
| 5,153,710 A * | 10/1992 | McCain | 257/724 |
| 5,595,939 A * | 1/1997 | Otake et al. | 438/51 |
| 5,859,759 A * | 1/1999 | Moriyama et al. | 361/283.4 |
| 6,311,561 B1 | 11/2001 | Bang et al. | |
| 6,877,380 B2 * | 4/2005 | Lewis | 73/715 |
| 6,978,681 B2 * | 12/2005 | Sasaki et al. | 73/756 |
| 7,152,478 B2 * | 12/2006 | Peterson et al. | 73/715 |
| 7,231,830 B2 | 6/2007 | Otsuka et al. | |

(Continued)

FOREIGN PATENT DOCUMENTS

DE 43 15 962 A1 10/1994

(Continued)

OTHER PUBLICATIONS

Pfeifer, G., et al., "Drucksensoren (Pressure Sensors)," VEB Verlag Technik, 1989, 142 pages, Berlin (English abstract only).

(Continued)

*Primary Examiner* — Lisa Caputo
*Assistant Examiner* — Jermaine Jenkins
(74) *Attorney, Agent, or Firm* — Slater & Matsil, L.L.P.

(57) ABSTRACT

A pressure sensor has a substrate with conductor tracks for contact-connecting electrical components. The pressure sensor has a measuring element for converting a mechanical measurement variable into an electrical signal and a signal converter for processing the electrical signals from the measuring element further. Furthermore, the pressure sensor has a first diaphragm which, together with the substrate, forms a first closed cavity which contains an inert filling medium. At least one side of the measuring element of the pressure sensor, which comprises an active surface, has direct contact with the filling medium in the first cavity. The signal converter is arranged on the substrate in the form of an unhoused integrated circuit.

18 Claims, 2 Drawing Sheets

U.S. PATENT DOCUMENTS

| | | | |
|---|---|---|---|
| 7,282,786 B2* | 10/2007 | Jung et al. | 257/666 |
| 7,317,199 B2* | 1/2008 | Inoguchi | 257/680 |
| 7,560,811 B2* | 7/2009 | Sakakibara et al. | 257/704 |
| 7,607,355 B2* | 10/2009 | Shirasaka et al. | 73/754 |
| 7,731,433 B1* | 6/2010 | Heinemann et al. | 385/93 |
| 7,781,852 B1* | 8/2010 | Faheem et al. | 257/419 |
| 7,994,618 B2* | 8/2011 | Dehe et al. | 257/684 |
| 2007/0017294 A1 | 1/2007 | Asada et al. | |
| 2009/0001553 A1 | 1/2009 | Pahl et al. | |

FOREIGN PATENT DOCUMENTS

| | | |
|---|---|---|
| DE | 197 09 977 A1 | 9/1998 |
| DE | 10 2005 045 380 A1 | 4/2006 |
| DE | 10 2005 060 642 A1 | 2/2007 |
| DE | 10 2005 053 765 A1 | 5/2007 |
| WO | WO 00/45143 A1 | 8/2000 |

OTHER PUBLICATIONS

Keller, "Piezoresistive Drucktransmitter; Absolut- und Relativdruck; Serie 23 S / 25 S (Piezo-Resistive Pressure Transmitter)," N.N. Produktkatalog 2003, Winterthur 2003, 3 pages (English abstract only).

Motorola, "Integrated Silicon Pressure Sensor On-Chip Signal Conditioned, Temperature Compensated and Calibrated," Motorola Semiconductor Technical Data, MPX5050/D, Jan. 2002, XP 007909192, 13 pages.

Wohlgemuth, C., et al., "Mikrogehäuste mediengetrennte Silizium-Druck- und Differenzdruck- sensoren für industrielle Anwendungen," Technisches Messen, vol. 71, Sep. 9, 2005, 15 pages, (English abstract only).

Kaden, G., "Packaging, the Key for Practical use of Piezoresistive Effect," Technisches Messen, vol. 72, Dec. 2005, 1 page (English abstract only).

E+H, "Deltabar S PMD75," Endress + Hauser Messtechnik GmbH & Co. KG, N.N. Produktkatalog 2007, 2 pages, (English Abstract Only).

* cited by examiner

PRESSURE SENSOR WITH A CLOSED CAVITY CONTAINING AN INERT FILLING MEDIUM

This application is a continuation of co-pending International Application No. PCT/EP2009/054656, filed Apr. 20, 2009, which designated the United States and was not published in English, and which claims priority to German Application No. 10 2008 021 091.9, filed Apr. 28, 2008, both of which applications are incorporated herein by reference.

TECHNICAL FIELD

U.S. Pat. No. 4,218,925 and U.S. Pat. No. 4,543,832 disclose pressure sensors.

BACKGROUND

Aspects of the present invention specify a pressure sensor that has a high integration density.

A pressure sensor has a substrate that is provided with conductor tracks for contact-connecting electrical components. The pressure sensor has a measuring element for recording and converting a mechanical measurement variable or an electrical intermediate variable into an electrical signal. The pressure sensor has a signal converter for further processing the electrical signal output by the measuring element. The signal converter is used, for example, to amplify the signal from the measuring transducer as well as to calculate temperature compensation and to standardize the measurement signal. The substrate of the pressure sensor forms, together with a first diaphragm, a first closed cavity which contains an inert filling medium, for example, oil.

At least one side of the measuring element of the pressure sensor, which comprises an active surface, has direct contact with the filling medium in the first cavity. The signal converter is preferably arranged on the substrate of the pressure sensor in the form of an unhoused chip (die) which comprises integrated circuits. In one preferred embodiment, one side of the signal converter, a silicon chip with integrated circuits or switching structures, is preferably in direct contact with the substrate of the pressure sensor. The signal converter therefore has considerably smaller dimensions than housed chips which are present in SMD form, for example. SMD chips are surrounded, for example, by a plastic or ceramic housing. A silicon chip with integrated conductor tracks is bonded to external contacts in the interior. The small dimensions of the silicon chip make it possible for the signal converter to be arranged in a depression of the substrate, for example.

In one preferred embodiment, the signal converter is arranged in a depression of the substrate.

In order to protect the signal converter, which comprises a silicon material with an integrated circuit, from mechanical damage and harmful environmental influences or corrosion, the signal converter is at least partially encased by an elastic material or preferably by a soft elastic material.

In another embodiment, the signal converter at least partially has direct contact with the filling medium.

In one preferred embodiment, the elastic material and the filling medium are the same substance.

In another embodiment, the first pressure sensor has an intermediate layer in sections between the first diaphragm and the substrate. The intermediate layer is preferably connected to the substrate by soldering or welding. The coefficient of thermal expansion of the intermediate layer is preferably matched to the coefficient of thermal expansion of the substrate. In one preferred embodiment, the intermediate layer is in the form of a ring to which the first diaphragm is applied. In one preferred embodiment, the intermediate layer contains Kovar.

Metal alloys which have a low coefficient of thermal expansion which is typically lower than the coefficient of most metals are referred to as Kovar. Such Kovar alloys have a coefficient of thermal expansion in the region of approximately 5 ppm/K. The different coefficients of thermal expansion of the substrate, of the diaphragm and of a process connection of the pressure sensor can be compensated for by the Kovar intermediate layer, thus resulting in tensions which are as low as possible in this case.

In one preferred embodiment, the diaphragm comprises a metal, in which case stainless steel is particularly suitable as the material for the diaphragm here.

In one preferred embodiment, the diaphragm has a structured surface which may comprise, for example, a concentrically spreading wavy pattern. The diaphragm is connected to the intermediate layer by soldering or welding, for example.

In order to measure the pressure of a medium relative to the ambient atmosphere in another embodiment, the rear side of the measuring element of the pressure sensor has direct contact with the atmosphere of the environment. For this purpose, the substrate of the pressure sensor has a cutout, for example, in the region of its rear side of the measuring element. The first cavity is preferably separated from the atmosphere of the environment by the measuring element.

In another embodiment, it is also possible for the pressure of the relative medium, for example, air, to be measured using a second measuring element.

In another embodiment, the pressure sensor is used to measure the differential pressure between two media applied to the pressure sensor. In this case, the substrate and a second metal diaphragm form a second closed cavity which contains an inert filling medium. The first cavity and the second cavity are preferably arranged on opposite sides of the substrate.

When measuring the differential pressure, the rear side of the measuring element has direct contact with the filling medium in the second cavity. The active side of the measuring element has direct contact with the filling medium in the first cavity.

In one preferred embodiment, the substrate comprises a ceramic which preferably comprises a plurality of layers. In this case, the ceramic may be, for example, an HTCC (high temperature cofired ceramic), for example, an aluminum oxide ceramic, or an LTCC (low temperature cofired ceramic), for example, a silicon oxide, an aluminum oxide or a lithium oxide ceramic.

The measuring element and the signal converter of the pressure sensor are preferably contact-connected via conductor tracks of the substrate. Bonding wires are preferably used to contact-connect the signal converter.

In order to contact-connect the pressure sensor to the outside, the conductor tracks of the substrate have at least one area which is arranged outside the first cavity and/or second cavity and can be contact-connected from the outside. As a result, the signal from the signal converter module can be directly output or processed further.

In order to fasten the pressure sensor to a media-filled tube whose pressure is intended to be determined, the pressure sensor has, at least on one side, a tubular connection. The medium to be measured has direct contact with the first or second diaphragm of the pressure sensor by the tubular connection. In one embodiment of the pressure sensor for measuring the differential pressure between two media, the pressure sensor has, on the sides of the cavities, a respective connection for fastening to the respective tube. The pressure sensor can also be fastened to the tube containing the medium to be measured, for example, using adapters between the pressure sensor connection and the tube.

The pressure sensor connection is preferably arranged on the outside of the first diaphragm and/or second diaphragm. In order to achieve a preferably gas-tight connection between the connection and the pressure sensor, the connection is sealed using an O-ring, for example.

In one embodiment, the connection may be in the form of a tube, a threaded connection, a grommet or else in the form of a so-called hose connection.

The pressure sensor is preferably suitable for measuring the absolute pressure or the relative pressure of a medium or for measuring the differential pressure between two media.

BRIEF DESCRIPTION OF THE DRAWINGS

The subject matters described above are explained in more detail using the following figures and exemplary embodiments.

The drawings described below should not be interpreted as being true to scale. Rather, individual dimensions can be increased, reduced or else distorted for the sake of better illustration. Elements which resemble one another or which undertake the same function are denoted using the same reference symbols.

Figure 1:
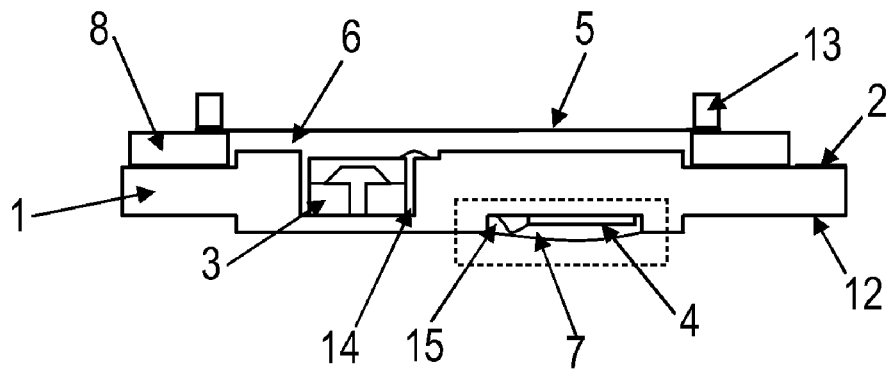
FIG. 1 shows a first embodiment of the pressure sensor for measuring the absolute pressure.

The following list of reference symbols may be used in conjunction with the drawings:
1 Substrate
2 Conductor track
3 Measuring element
4 Signal converter
5 First diaphragm
6 First cavity
7 Elastic material
8 Intermediate layer
9 Cutout
10 Second diaphragm
11 Second cavity
12 Contact area
13 Connection
14 First depression
15 Second depression

DETAILED DESCRIPTION OF ILLUSTRATIVE EMBODIMENTS

FIG. 1 shows a first embodiment of the pressure sensor which comprises a ceramic substrate 1. A measuring element 3 is arranged in a first depression 14 of the substrate. The measuring element 3 is electrically contact-connected via bonding wires or using conductor tracks 2, which are applied to the substrate 1. An active side of the measuring element 3 preferably has direct contact with a first cavity 6. The first cavity 6 is formed by the substrate 1, an intermediate layer 8 and a first diaphragm 5. The intermediate layer 8 preferably has a coefficient of thermal expansion which is matched to the coefficient of thermal expansion of the substrate 1. The first cavity 6 is preferably filled with an inert filling medium, for example, oil.

A signal converter 4 is arranged in a second depression 15 of the substrate 1 on the side of the substrate 1 that is opposite the first cavity 6. The signal converter 4 is preferably in the form of an unhoused silicon chip with integrated circuits. The signal converter 4 is contact-connected to conductor tracks 2 of the substrate 1 using bonding wires.

In order to protect the signal converter 4 from mechanical damage and harmful environmental influences or corrosion by the ambient air of the pressure sensor, the signal converter 4 is encased by a soft elastic mass 7, for example.

In order to connect the pressure sensor to a media-filled tube whose pressure is intended to be determined, the pressure sensor has a connection 13 above the first diaphragm 5. The connection 13 may be in the form of a tube, a threaded connection, a grommet or a so-called hose connection. The pressure of the medium therefore has direct contact with the measuring element 3 of the pressure sensor via the first diaphragm 5 and the inert filling medium in the first cavity 6.

In another possible embodiment, the signal converter 4 may also be arranged on that side of the substrate 1 on which the first cavity 6 is arranged. In this case, the signal converter 4 is surrounded by the inert filling medium in the first cavity 6 and is thus protected from corrosion or environmental influences. In this embodiment, there is therefore no need for a further elastic material 7 in order to protect the signal converter 4. In this case, the function of the elastic material 7 has already been undertaken by the inert filling medium in the first cavity 6.

Figure 2:
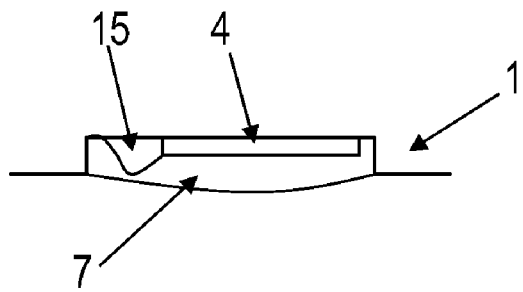
FIG. 2 shows a section from FIG. 1 which shows the signal converter module on the substrate of the pressure sensor.

FIG. 2 illustrates a section from FIG. 1 which shows how the signal converter 4 is arranged in a second depression 15 of the substrate 1. The signal converter 4, which is in the form of an unhoused silicon chip, is contact-connected to conductor tracks 2 of the substrate 1 using bonding wires. In order to protect the silicon of the signal converter 4 from mechanical damage and corrosion or other environmental influences, the signal converter 4 is at least partially encased by an elastic material 7. The signal converter 4 preferably lies directly on the substrate 1. In the embodiment illustrated, the signal converter 4 is arranged in a second depression 15 of the substrate 1, the elastic material 7 filling the second depression 15 in the substrate 1 and thus preferably completely covering the signal converter 4. As a result, the signal converter 4 is protected from external influences, for example, corrosion. The elastic material 7 preferably has a low hardness, with the result that the signal converter 4 can expand as the pressure sensor is heated without resulting in harmful tensions in the signal converter 4.

Figure 3:
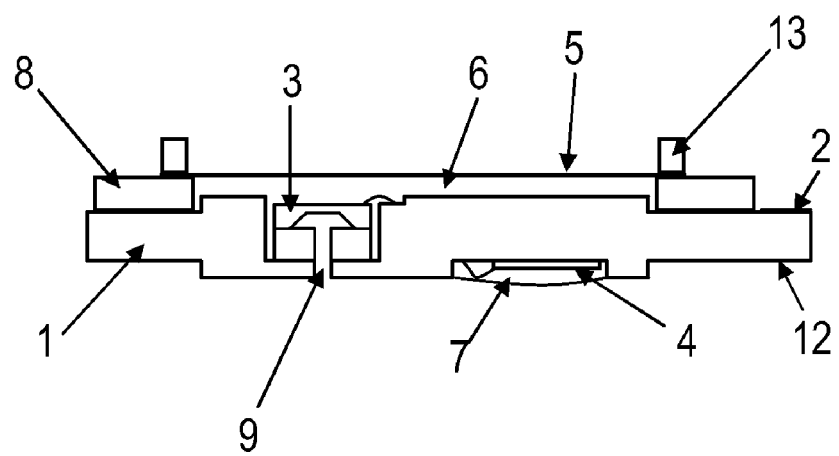
FIG. 3 shows another embodiment of the pressure sensor for measuring the relative pressure.

FIG. 3 shows another embodiment of the pressure sensor for determining the relative pressure of a medium. In order to measure the pressure of a medium relative to the surrounding atmosphere, a second side of the measuring element 3 of the pressure sensor has direct contact with the atmosphere. For this purpose, the substrate 1 of the pressure sensor has a cutout 9, with the result that there is direct contact between the measuring element 3 and the air atmosphere, for example. A first side of the measuring element 3 has direct contact with a first cavity 6 of the pressure sensor. The first cavity 6 thus has contact with the medium to be measured via the first diaphragm 5 and is preferably separated from the atmosphere surrounding the pressure sensor by the measuring element 3. This arrangement makes it possible to determine the pressure of a medium, which acts on the first diaphragm 5 of the pressure sensor, with respect to the atmospheric pressure of the pressure sensor environment.

Figure 4:
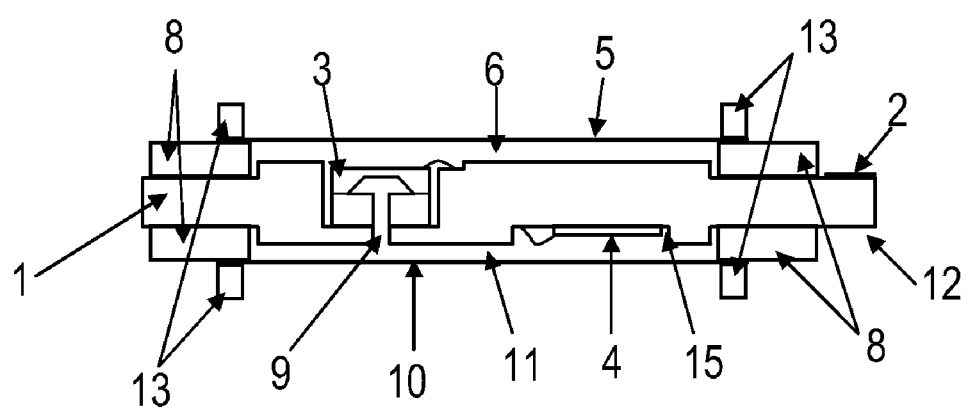
FIG. 4 shows another embodiment of the pressure sensor for measuring the differential pressure.

FIG. 4 illustrates another embodiment of the pressure sensor which is used to measure the differential pressure between two media which are both applied to the pressure sensor. For this purpose, the substrate 1 of the pressure sensor has two cavities 6, 11 which are separate from one another. An active side of the measuring element 3 has direct contact with the first cavity 6 and a second side of the measuring element 3 has direct contact with the second cavity 11 via a cutout 9 in the substrate 1. The first cavity 6 and the second cavity 11 of the pressure sensor are each filled with inert filling media.

In the embodiment illustrated, a signal converter 4 is arranged in a second depression 15 on the underside of the substrate 1. The signal converter 4 is preferably partially surrounded by the filling medium in the second cavity 11. In the embodiment of the pressure sensor illustrated in FIG. 4, the signal converter is not encased by an additional, preferably soft elastic material for protection from environmental influences. The task of protecting the signal converter 4 from corrosion or environmental influences is undertaken by the filling medium in the second cavity 11 in this case.

The greatest possible integration of the pressure sensor is achieved by integrating an unhoused signal converter 4 in a depression of the substrate or on the substrate 1 or in the cavity filled with an inert filling medium. The greatest possible functional integration of the measuring element 3 and of the signal converter 4 in the pressure sensor thus makes it possible to achieve a minimum dimension of the pressure sensor, the quality of the materials with respect to the temperature and pressure hysteresis, as important characteristic variables for sensor construction, remaining at least the same as in conventional designs. The short paths of the signal line reduce the distortion of the introduced pressure and reduce the injection of electrical signal interference, in which case the costs of producing the pressure sensor can be considerably reduced as a result of all functions being integrated in the sensor housing.

Although it was possible to describe only a restricted number of possible developments of the invention in the exemplary embodiments, the invention is not restricted thereto. In principle, it is possible to adapt the shape of the pressure sensor to desired fields of application or to adapt the pressure sensor to the required specifications by selecting the shape and properties of the measuring element or of the signal converter.

The invention is not restricted to the number of elements illustrated.

The description of the stated subject matters is not restricted to the individual special embodiments. Rather, the features of the individual embodiments can be combined with one another as desired, insofar as technically useful.

What is claimed is:

1. A pressure sensor comprising:
   a substrate which has conductor tracks for contact-connecting electrical components;
   a measuring element configured to convert a mechanical measurement variable into an electrical signal;
   a signal converter configured to process electrical signals from the measuring element;
   a first diaphragm which, together with the substrate, forms a first closed cavity that contains an inert filling medium; and
   a second diaphragm, wherein the substrate and the second diaphragm form a second closed cavity that contains an inert filling medium, the first closed cavity and the second closed cavity being arranged on an opposite side of the substrate;
   wherein at least one side of the measuring element, which comprises an active surface, has direct contact with the filling medium in the first closed cavity, and
   wherein the signal converter is arranged on the substrate and comprises an unhoused integrated circuit.

2. The pressure sensor as claimed in claim 1, wherein the signal converter is located in a second depression of the substrate.

3. The pressure sensor as claimed in claim 1, wherein the signal converter is at least partially encased by an elastic material.

4. The pressure sensor as claimed in claim 1, wherein the signal converter at least partially has direct contact with the filling medium.

5. The pressure sensor as claimed in claim 1, further comprising an intermediate layer arranged in sections between the first diaphragm and the substrate, a coefficient of thermal expansion of the intermediate layer being matched to a coefficient of thermal expansion of the substrate.

6. The pressure sensor as claimed in claim 5, wherein the intermediate layer comprises a ring.

7. The pressure sensor as claimed in claim 1, wherein a rear side of the measuring element has direct contact with the ambient atmosphere.

8. The pressure sensor as claimed in claim 1, wherein a rear side of the measuring element has direct contact with the filling medium of the second closed cavity.

9. The pressure sensor as claimed in claim 1, wherein the substrate comprises a ceramic.

10. The pressure sensor as claimed in claim 1, wherein the measuring element and the signal converter are contact-connected via the conductor tracks of the substrate.

11. The pressure sensor as claimed in claim 1, wherein the conductor tracks of the substrate have at least one area that is arranged outside the first closed cavity and is connectable from the outside.

12. The pressure sensor as claimed in claim 11, wherein the conductor tracks of the substrate have at least one second area that is arranged outside the second closed cavity and is connectable from the outside.

13. The pressure sensor as claimed in claim 1, further comprising a tubular connection serving to further fasten the pressure sensor.

14. The pressure sensor as claimed in claim 13, wherein the tubular connection is at least partially arranged on the first diaphragm.

15. The pressure sensor as claimed in claim 13, wherein the tubular connection is at least partially arranged on the second diaphragm.

16. The pressure sensor as claimed in claim 1, which is a pressure sensor for measuring the absolute pressure.

17. The pressure sensor as claimed in claim 1, which is a pressure sensor for measuring the relative pressure.

18. The pressure sensor as claimed in claim 1, which is a pressure sensor for measuring the differential pressure.

* * * * *